United States Patent
Shishido et al.

(10) Patent No.: US 7,211,708 B2
(45) Date of Patent: May 1, 2007

(54) EXHAUST PROCESSING METHOD, PLASMA PROCESSING METHOD AND PLASMA PROCESSING APPARATUS

(75) Inventors: Takeshi Shishido, Nara (JP); Shotaro Okabe, Nara (JP); Masahiro Kanai, Tokyo (JP); Yuzo Koda, Kyoto (JP); Yasuyoshi Takai, Nara (JP); Tadashi Hori, Nara (JP); Koichiro Moriyama, Kyoto (JP); Hidetoshi Tsuzuki, Kanagawa (JP); Hiroyuki Ozaki, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 600 days.

(21) Appl. No.: 09/822,191

(22) Filed: Apr. 2, 2001

(65) Prior Publication Data

US 2002/0006477 A1 Jan. 17, 2002

(30) Foreign Application Priority Data

Apr. 3, 2000 (JP) ............................. 2000-100213

(51) Int. Cl.
  *A62D 3/00* (2006.01)
  *B08B 15/00* (2006.01)
  *B08B 5/00* (2006.01)
  *H05H 1/03* (2006.01)
  *H05H 1/16* (2006.01)
  *H05H 1/48* (2006.01)

(52) U.S. Cl. ...................... 588/321; 427/569; 427/562; 134/1; 216/67; 118/723 R; 118/723 E; 118/723 I

(58) Field of Classification Search ..................... 134/1, 134/1.1; 427/446, 448, 523, 533, 535, 562, 427/569, 526; 216/67, 94; 204/192.12, 204/192.13, 192.32, 192.38, 298.09, 298.07, 204/298.33, 298.41; 118/723 MW, 723 HC, 118/723 E, 723 I; 588/261

See application file for complete search history.

(56) References Cited

U.S. PATENT DOCUMENTS 4,735,633 A * 4/1988 Chiu
5,126,169 A    6/1992 Ishihara et al. .......... 427/255.1

(Continued)

FOREIGN PATENT DOCUMENTS

JP         4-136175         5/1992

(Continued)

OTHER PUBLICATIONS

Machine translation—JP08-218,174 to Chiba Hideshige et al & Patent Abstract of Japan, Aug. 1996.*

(Continued)

*Primary Examiner*—Marianne Padgett
(74) *Attorney, Agent, or Firm*—Fitzpatrick, Cella, Harper & Scinto

(57) ABSTRACT

A chemical-reaction inducing means is provided in an exhaust line connecting a processing space for subjecting a substrate or a film to plasma processing to an exhaust means, and at least either an unreacted gas or byproduct exhausted from the processing space are caused to chemically react without allowing plasma in the processing space to reach the chemical-reaction inducing means, thereby improving the processing ability of the chemical-reaction inducing means to process the unreacted gas or byproduct.

6 Claims, 2 Drawing Sheets

U.S. PATENT DOCUMENTS

| | | | |
|---|---|---|---|
| 5,130,170 A * | 7/1992 | Kanai et al. | |
| 5,137,701 A * | 8/1992 | Mundt | 423/210 |
| 5,370,739 A * | 12/1994 | Foster et al. | 118/725 |
| 5,468,521 A | 11/1995 | Kanai et al. | 427/575 |
| 5,482,557 A | 1/1996 | Kanai et al. | 118/719 |
| 5,569,810 A * | 10/1996 | Tsuji | 427/490 |
| 5,575,855 A | 11/1996 | Kanai et al. | 118/718 |
| 5,897,332 A * | 4/1999 | Hori et al. | 438/61 |
| 5,900,103 A * | 5/1999 | Tomoyasu et al. | 156/345.44 |
| 5,976,257 A * | 11/1999 | Kanai et al. | 427/571 |
| 6,031,198 A | 2/2000 | Moriyama et al. | 219/121.57 |
| 6,106,625 A * | 8/2000 | Koai et al. | 118/715 |
| 6,153,013 A | 11/2000 | Sakai et al. | 118/719 |
| 6,159,300 A | 12/2000 | Hori et al. | 118/718 |
| 6,189,482 B1 * | 2/2001 | Zhao et al. | 118/723 R |
| 6,194,628 B1 * | 2/2001 | Pang et al. | 118/723 MW |
| 6,223,684 B1 | 5/2001 | Fujioka et al. | 118/723 |
| 6,361,706 B1 * | 3/2002 | Gabriel | 588/210 |
| 6,403,491 B1 * | 6/2002 | Liu et al. | 438/710 |
| 7,009,281 B2 * | 3/2006 | Bailey et al. | 257/642 |
| 7,022,293 B2 * | 4/2006 | Hogan | 422/184.1 |
| 7,022,298 B2 * | 4/2006 | Hasegawa | 423/210 |
| 7,044,997 B2 * | 5/2006 | Mardian et al. | 95/1 |
| 7,109,660 B2 * | 9/2006 | Ishihara et al. | 315/111.11 |
| 2005/0003675 A1 * | 1/2005 | Carducci et al. | 438/710 |
| 2006/0051254 A1 * | 3/2006 | Seol | 422/109 |
| 2006/0101993 A1 * | 5/2006 | Mardian et al. | 95/1 |
| 2006/0105575 A1 * | 5/2006 | Bailey et al. | 438/706 |

FOREIGN PATENT DOCUMENTS

| | | |
|---|---|---|
| JP | 8-218174 | 8/1996 |
| JP | 08-299784 A * | 11/1996 |
| JP | 2006-224066 A * | 8/2006 |
| JP | 2006-297275 A * | 11/2006 |

OTHER PUBLICATIONS

Machine translation —JP07-130,674 to Miyagi Katsuncbu et al & Patent Abstract, May 1995.*
Patent Abstract of Japan for JP04-136,175 to Tanimura Shoichi, May 1992.*
Translation of JP 04-136175 A to Shoichi Tanimura, pub. May 1992.*

* cited by examiner

EXHAUST PROCESSING METHOD, PLASMA PROCESSING METHOD AND PLASMA PROCESSING APPARATUS

BACKGROUND OF THE INVENTION

1. Field of the Invention

The present invention relates to an exhaust processing method, and a plasma processing method and apparatus, and more specifically, to an exhaust processing method, and a plasma processing method and apparatus which are used to execute plasma processing on substrates or films by a plasma CVD apparatus or a sputtering apparatus for forming films or by a dry etching apparatus for processing deposited films during a process of fabricating semiconductor devices.

2. Related Background Art

Plasma processing is generally and widely used as a method of using energy such as electromagnetic waves, heat, or light to excite a raw material gas to obtain plasma and exposing a predetermined substrate to the plasma to deposit a film thereon or execute doping, etching, or the like.

For example, the plasma CVD process comprises introducing a raw material gas into a plasma processing chamber, reducing the pressure in the plasma processing chamber by means of an exhaust pump, and applying a direct current, a high-frequency wave, or microwave power to the raw material gas to ionize, dessociate, or excite it into plasma to thereby form a deposited film on a substrate. The plasma CVD process conventionally uses parallel plate electrodes as well as glow discharge or RF discharge using high frequency.

In addition to the discharge process using parallel plate electrodes, a process of decomposing a compound gas and depositing a film by means of thermal energy has been used. The process using heat energy includes the Hot Wall process of using a gas with a relatively low decomposition temperature such as $Si_2H_6$ as a raw material and heating the plasma processing chamber itself to decompose the gas and the thermal CVD process of obtaining a similar effect to the above process by heating a substrate. Furthermore, there is the hot wire CVD process comprising depositing a thin film using a metallic filament such as a tungsten filament which is heated beyond the melting point of silicon crystals. Additionally, there is the optical CVD process comprising decomposing a raw material gas to form a deposited film by irradiating a substrate surface with light such as ultraviolet rays.

The dry etching process is general as a deposited-film processing method for, after forming a deposited film such as an amorphous semiconductor film, a microcrystal semiconductor film, or an insulating film, processing the film into a desired pattern or thickness.

To form a silicon-based amorphous or microcrystal semiconductor film, a raw material gas such as $SiH_4$, $Si_2H_6$, $SiF_4$, or $Si_2F_6$ is used. A doping gas such as $BF_3$, $B_2H_6$, or $PH_3$ is used. Further, to form a silicon germanium-based amorphous film or microcrystal film, a $GeH_4$ gas, in addition to the above gases, is often used as the raw material gas.

The (plasma) pressure in the plasma processing chamber must be about $1.3 \times 10^1$ Pa to $1.3 \times 10^3$ Pa in order to supply power ranging from DC to high frequency. It must be $1.3 \times 10^{-1}$ Pa to $1.3 \times 10^2$ Pa in order to supply microwave power. Additionally, the substrate is heated at 200 to 400° C.

FIG. 2 shows a schematic sectional view of a plasma CVD apparatus as one of representative prior art deposited-film forming apparatuses. With reference to FIG. 2, an example will be described in which an amorphous silicon film is produced by means of a general plasma CVD process using a high frequency. In FIG. 2, reference numeral 1 denotes a plasma processing chamber, reference numeral 2 denotes an exhaust means (a rotary pump and a mechanical booster pump), reference numeral 3 denotes an exhaust line, reference numeral 4 denotes a conductance adjusting valve, reference numeral 5 denotes a power applying electrode, reference numeral 6 denotes a high-frequency power source, reference numeral 7 denotes a high-frequency introducing section, reference numeral 8 denotes a substrate, reference numeral 9 denotes a substrate holder, reference numeral 10 denotes gas introducing section, reference numeral 11 denotes a pressure gauge, reference numeral 12 denotes a discharge region, and reference numeral 15 denotes an exhaust line heater.

The substrate 8 is fixed to the substrate holder 9, a substrate access port (not shown) of the plasma processing chamber 1 is closed, and the exhaust means 2 is used to exhaust the plasma processing chamber 1 to thereby reduce the pressure therein. The substrate 8 is heated to a temperature that meets plasma processing conditions, by means of a substrate heater (not shown) fixed to the substrate holder 9. A plurality of deposited-film-forming raw material gases ($SiH_4$, $Si_2H_6$, $H_2$, a doping gas) supplied from gas cylinders (not shown) at flow rates controlled via a gas flow controllers (not shown) are mixed together and supplied to the discharge region 12 in the plasma processing chamber 1 through the gas introducing section 10. A high frequency from the high-frequency power source 6 is applied to the power applying electrode 5 to induce discharging in the discharge region 12 between the power applying electrode 5 and the substrate 8 and substrate holder 9 which are located opposite to the power applying electrode 5 and acting as a substrate electrode.

The gas in the plasma processing chamber 1 is discharged by the exhaust means 2 through the exhaust line 3 so as to be constantly replaced with a newly supplied gas. The pressure in the discharge region 12 is monitored by the pressure gauge 11 so that, based on a resulting pressure signal, the opening degree of a conductance adjusting valve 4 provided in the path of the exhaust line 3 is adjusted to control the pressure in the discharge region 12 at a constant value. The deposited-film-forming raw material gas is ionized, dessociated, or excited in plasma induced in the discharge region 12, to form a deposited film on the substrate 8.

The conductance adjusting valve 4 is useful for adjusting the pressure to a desired value regardless of the flow rate of the raw material gas. The conductance adjusting valve 4 increases or decreases exhaust conductance by varying the cross section of the exhaust line 3.

After a deposited film has been formed, the supply of the raw material gas is stopped, and a purge gas (He, Ar, or the like) is newly introduced to sufficiently substitute for the raw material gas remaining in the plasma processing chamber 1 or the exhaust means 2. After the purging has been completed and the plasma processing chamber 1 has then cooled down, the pressure is returned to the atmospheric pressure and the substrate 8 is then removed.

The exhaust line heater 15 provided on the exhaust line 3 extending from the plasma processing chamber 1 to the exhaust means 2 increases the temperature of the exhaust line 3 to cause the decomposition and reaction of byproducts before they are removed.

The byproducts as used herein refer to powders which are generated in the plasma under discharge conditions (the pressure, gas flow rate, and power value) when a $SiH_4$-based gas is used and which adhere to or deposit on the electrode, the substrate holder, a wall of the chamber or exhaust line, or the surface of the valve. Conventionally, the byproducts have been removed by a method in which a temperature is elevated using the exhaust line heater 15 to cause the decomposition and reaction of the byproducts.

Further, Japanese Patent Application Laid-Open No. 8-218174 discloses a method of providing a trap on the exhaust line, and precipitating and coagulating byproducts on the trap while heating the location between the plasma processing chamber and the trap to prevent the byproducts from adhering to the exhaust line wall. Japanese Patent Application Laid-Open No. 7-130674 discloses a process of providing opposite electrodes on the trap on the exhaust line and inducing discharging to deposit an unreacted gas and the byproducts on the surface of a wall of the trap as a hard film. Japanese Patent Application Laid-Open No. 4-136175 discloses a process of reducing the amount of unreacted gas by using a reaction chamber in which plasma is induced to cause the reaction of an unreacted gas to thereby form a film.

Problems with a plasma processing apparatus for forming (processing) a deposited film by means of plasma processing are the adverse effects on film quality due to the mixture of the byproducts into the deposited film, the byproducts being generated during plasma processing and adhering to or depositing on locations other than the substrate, as well as the necessity of maintenance for the apparatus for removing the byproducts adhering to or depositing on the exhaust line or the valve.

The byproducts attached to the inside of the plasma processing chamber sucks the gas or whirls inside it and may be caught in the deposited film on the substrate as dusts or contamination to adversely affect the characteristics of the deposited film.

Further, the byproducts attached to the exhaust means may significantly increase the viscosity of a pump oil when the exhaust means comprises a rotary pump or may adhere to rotors, which may contact with each other to cause malfunction, when the exhaust means comprises a mechanical booster pump or a dry pump. Additionally, as described previously, when the byproducts attached to the exhaust pipe wall or valve grow to reduce the effective cross section thereof, the exhaust conductance may decrease gradually, thereby making it impossible to obtain a desired discharge pressure in the plasma processing chamber. Furthermore, the conductance adjusting valve may malfunction.

In FIG. 2, as described previously, the exhaust line heater 15 is used to increase the temperature in the exhaust line 3 to remove the byproducts by causing decomposition or reaction thereof. It is difficult, however, for this process to sufficiently raise the temperature in the exhaust line, the pressure of which has been reduced, that is, this process is thus insufficient as a method for removing the byproducts.

The dry etching process is also known as the method for removing the byproducts. The dry etching process comprises inducing discharging in the plasma processing chamber to etch the byproducts in the exhaust line by means of radicals of an etching gas with a long lifetime or inducing discharging in the exhaust line for etching. The etching, however, requires considerations for the corrosiveness of the plasma processing chamber members, the exhaust line member, and the exhaust pump, and for the effects of etching residues or byproducts as contamination during the formation (processing) of the deposited film.

Another conventional process comprises providing a trap in the exhaust line, arranging parallel plate electrodes inside the trap, and decomposing and depositing an unreacted compound gas in the trap using glow discharge or high-frequency-based RF discharge. The unreacted compound gas, however, is decomposed and deposited on the surface of a wall of the trap at a low rate, so that the byproducts may disadvantageously be transported to the exhaust pump. Further, arrangement of the parallel plate electrode inside the trap requires a certain amount of space, resulting in no degree of freedom for the installation of the trap.

Another conventional process comprises installing a heating element inside the trap to directly heat the interior of the exhaust line. This process is effective on the removal of the byproducts, but plasma that has grown up to the interior of the trap may not only decompose the byproducts but also generate them, thereby dispersing the effects of the heating element.

Although the plasma CVD process is more often used for industrial purposes, that is, to produce semiconductor films, there is a demand for a further increase in the area of the film formed and in the amount of time spent in film formation and thus an associated increase in the amount of byproducts deposited in the exhaust system is a concern. The conventional methods as described above, however, are insufficient to prevent the deposition of the byproducts.

SUMMARY OF THE INVENTION

In view of the above problems, an object of the present invention is to provide an exhaust processing method, a plasma processing method and a plasma processing apparatus which sufficiently and efficiently remove unreacted gases and byproducts generated from the formation (or processing) of deposited films using plasma processing, which prevent the corrosion of an exhaust line, a valve, or an exhaust pump and the deposition of byproducts thereon to reduce the frequency of maintenance over a long period, which enables improvement of the operation rate and simplification of the apparatus, which can sufficiently and efficiently remove unreacted gases and byproducts having the amount increased when films are formed over a large area and over a long period, and which avoid affecting deposited films.

The present invention provides an exhaust processing method for a processing space for subjecting a substrate or a film to plasma processing, which comprises providing a chemical-reaction inducing means in an exhaust line connecting the processing space to an exhaust means, and causing at least either unreacted gases or byproducts discharged from the processing space to chemically react without allowing plasma in the processing space to reach the chemical-reaction inducing means.

Further, the present invention provides a plasma processing method for subjecting a substrate or a film to plasma processing, which comprises arranging a chemical-reaction inducing means in an exhaust line connecting a processing space for plasma processing to an exhaust means for exhausting the processing space, and causing at least either unreacted gases or byproducts discharged from the processing space to chemically react without allowing plasma in the processing space to reach the chemical-reaction inducing means.

Additionally, the present invention provides a plasma processing apparatus comprising a processing space for subjecting a substrate or a film to plasma processing, an exhaust means for exhausting the processing space, and an exhaust line connecting the processing space to the exhaust means, wherein a chemical-reaction inducing means is provided in the exhaust line, and means for blocking plasma is arranged between the processing space and the chemical-reaction inducing means.

In the exhaust processing method and the plasma processing method and apparatus as described above, the chemical-reaction inducing means preferably causes chemical reaction of at least either unreacted gases or byproducts discharged from the processing space due to heating.

The chemical-reaction inducing means preferably comprises a metal member of a high melting point.

The metal member of a high melting point preferably contains at least one of chromium, molybdenum, tungsten, vanadium, niobium, tantalum, titanium, zirconium, and hafnium.

Further, means for blocking plasma is preferably provided between the processing space and the chemical-reaction inducing means.

Preferably, a conductive member is provided as the means for blocking plasma and has a potential different from that in a plasma space.

The conductive member is preferably a metal member.

Further, the conductive member preferably has the same material quality as that of the chemical-reaction inducing means.

The means for blocking plasma is preferably an electrically grounded member.

Additionally, the means for blocking plasma comprises one or more linear members or spirally-wound linear members.

Further, the means for blocking plasma preferably comprises a mesh.

The means for blocking plasma preferably comprises a plate-like member that is shaped to prevent passage of the plasma.

Further, the means for blocking plasma preferably comprises a plate-like member with openings.

Additionally, the means for blocking plasma preferably comprises a plate-like member that is arranged in the exhaust line so that a gap is provided between the plate-like member and an inner wall of the exhaust line.

The plasma processing preferably is film formation based on the plasma CVD process.

Further, the plasma processing preferably is plasma etching of a substrate or a film.

Furthermore, the present invention provides a plasma processing apparatus comprising a processing space for subjecting a substrate or a film to plasma processing, an exhaust means for exhausting the processing space, and an exhaust line connecting the processing space to the exhaust means, wherein a first metal member is located in the exhaust line and connected to a power source, and a second metal member is located between the processing space and the first metal member and which is electrically grounded.

In the plasma processing apparatus, the first and second metal members preferably comprise the same material.

The first and second metal members preferably has the same shape.

Further, the first and second metal members preferably each comprise a filament.

Additionally, the first metal member is preferably heated by means of power supplied by the power source.

DETAILED DESCRIPTION OF THE PREFERRED EMBODIMENTS

The present invention will be described below with reference to a preferred embodiment but is not limited to this embodiment.

Figure 1:
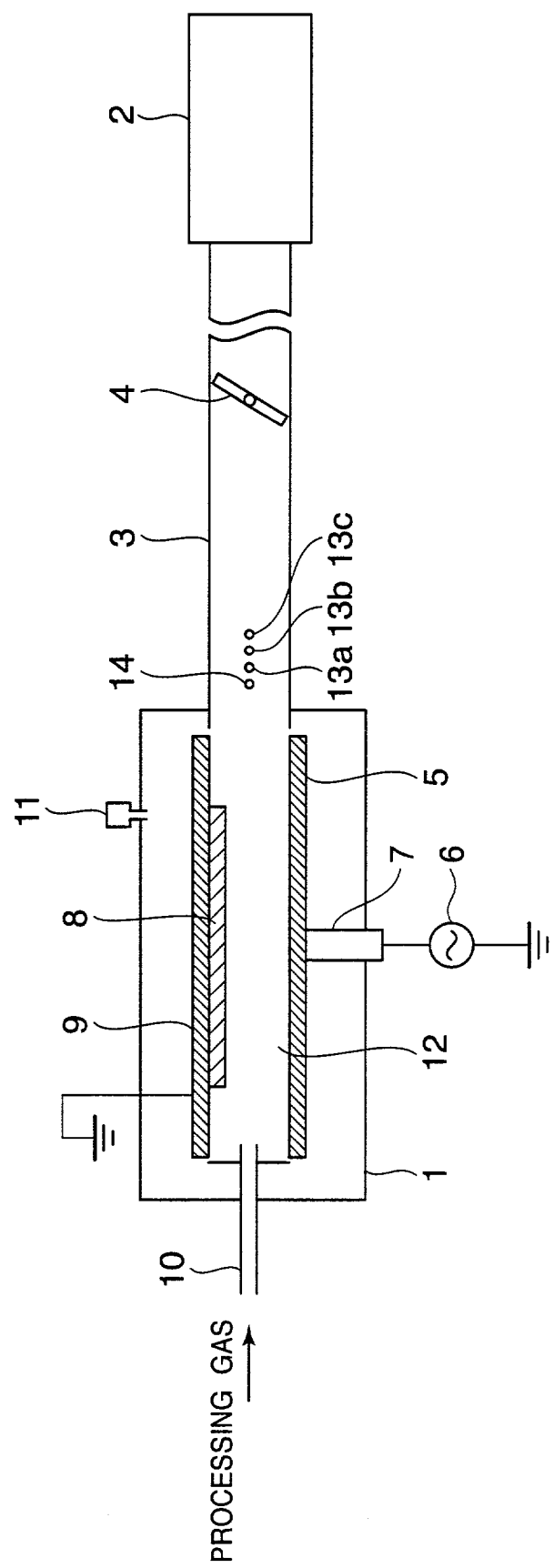
FIG. 1 is a schematic sectional view of one embodiment of a plasma processing apparatus according to the present invention using the plasma CVD process.
Figure 2:
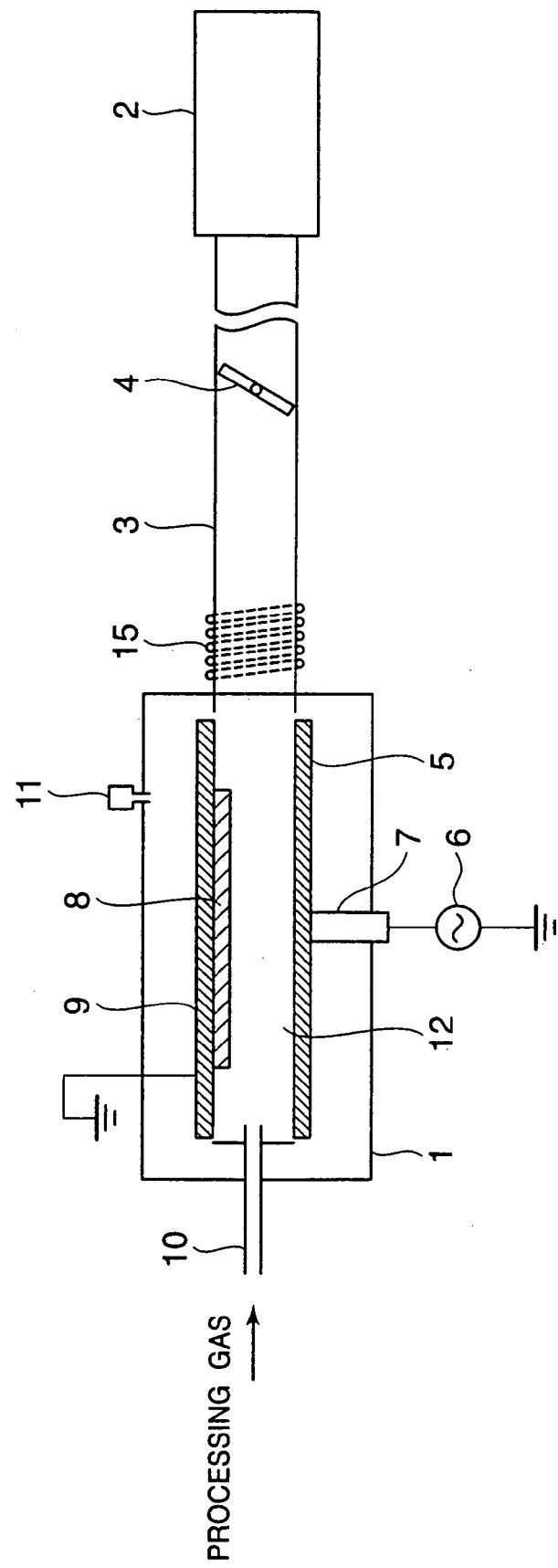
FIG. 2 is a schematic sectional view of a plasma CVD apparatus as one of representative deposited-film forming apparatuses.

FIG. 1 is a schematic sectional view of one embodiment of a plasma processing apparatus according to the present invention using the plasma CVD process. In FIG. 1, the same members as those in FIG. 2 are denoted by the same reference numerals, and description thereof is omitted. Further, in FIG. 1, reference numerals 13a to 13c denote heating elements as first metal members which are chemical-reaction means for processing byproducts, and reference numeral 14 denotes a plasma shield member as a second metal member.

In the present invention, a thin film such as a semiconductor can be deposited on a substrate by applying a low frequency of 5 kHz to 500 Hz, a high frequency of 500 kHz to 30 MHZ, or a VHF of 30 MHZ to 500 MHZ to electrodes called "power applying electrodes" to induce plasma in a discharge region 12 so that low-frequency plasma, high-frequency plasma, or VHF plasma can be used as desired. As means for inducing plasma, a bar-shaped antenna can be installed in the discharge region 12 or electromagnetic waves can be supplied from a waveguide through a window.

A substrate 8 may be a light-transmitting insulative substrate such as glass substrate or a non-light-transmitting conductive substrate such as stainless steel substrate. Alternately, it may be an elongate belt-like substrate wound like a coil, a conductive film formed on a flexible insulator such as a polymeric film, or a flexible conductive substrate made of stainless steel.

When a deposited film is formed by means of plasma CVD and when, for example, an amorphous silicon film is deposited using a raw material gas such as $SiH_4$ or $Si_2H_6$, the prior art requires periodical removal of byproducts attached to an exhaust line 3 therefrom, and special measures have been required in order to remove the byproducts after film formation. In the present invention, unreacted gases or byproducts introduced into the heating elements 13a to 13c are deposited, as a hard stable film, on the surface of a wall of the exhaust line 3 around the heating elements 13a to 13c by means of chemical reaction such as a catalyst action, thermal decomposition, thermal electron irradiation, or electron beam irradiation, whereby these gases or byproducts can thus removed easily.

The discharge region 12 is located between the power applying electrode 5 and the substrate 8 and substrate holder 9 as a substrate electrode, and plasma is essentially generated in the discharge region. The plasma, however, more or less extends toward the exhaust line 3 in connection with the lifetime of the plasma, the flow rate of the gas, and the amount of electromagnetic waves reaching locations other than the discharge region 12.

The inventors have found that the relationship between the plasma extending from the discharge region 12 and the heating elements 13a to 13c significantly affects the ability of processing unreacted gases and byproducts. That is, the ability of processing introduced unreacted gases and byproducts can be improved by causing block of plasma on the side of the discharge region 12 of the heating elements 13a to 13c so as to allow the heating elements 13a to 13c to act with the unreacted gases and the byproducts separately from the plasma.

The raw material gas used to form (or process) a deposited film according to the present invention includes, for example, an amorphous silicon-forming raw material gas such as $SiH_4$ or $Si_2H_6$, a raw material gas such as $GeH_4$, and a mixture thereof. To dilute these raw material gases, $H_2$, Ar, He, or the like is used. Additionally, for doping, a dopant gas such as $B_2H_6$, $BF_3$, or $PH_3$ may be simultaneously introduced into the discharge space.

Etching gases used include, for example, $CF_4O_2$, $CH_xF_{(4-X)}$, $SiH_xF_{(4-X)}$, $SiH_xCl_{(4-X)}$, $CH_xCl_{(4-X)}$, (X=0, 1, 2, 3, 4), $ClF_3$, $NF_3$, $BrF_3$, $IF_3$, and a mixture thereof.

The inventors consider that the present invention provides the following effects.

Unreacted gases and byproducts introduced by the above-described chemical-reaction inducing means are deposited on the surface of the surrounding wall as a hard film, which can then be removed easily.

Since the chemical-reaction inducing means is more effective when installed near the plasma processing chamber, it is installed so and however the plasma may extend from the plasma processing chamber to the chemical-reaction inducing means depending on film forming conditions or the like. In such a case, the chemical-reaction inducing means not only processes unreacted gases and byproducts but also generates byproducts.

The ability to process unreacted gases and byproducts were actually improved when the plasma was prevented from reaching the chemical-reaction inducing means.

Glow discharge plasma has an electron number density Ne of ranging from $10^7$ to $10^{13}$ $cm^{-3}$. A state in which the "plasma does not reach" the chemical-reaction inducing means according to the present invention means a state in which the electron number density decreases down to one tenths of that in the plasma.

The chemical-reaction inducing means may comprise heating elements of a high melting point such as chromium, molybdenum, tungsten, vanadium, niobium, tantalum, titanium, zirconium, or hafnium. The means for blocking plasma preferably comprises a metal of a high melting point which can endure heat from the heating elements or the plasma.

The means for blocking plasma may be shaped to be one or more linear objects or spirally-wound linear objects. For example, the use of a mesh serves to more significantly reduce the electron number density. Films may deposit on the mesh to affect the exhaust of the gas depending on the film forming conditions. The electron number density is also reduced by means of a plate-like member shaped to prevent the passage of plasma, for example, those having openings. In this case, in view of the effects of the openings on the exhaust, the openings preferably have a larger diameter but the minimum diameter of the openings must be set to be double a sheath length formed by the plasma and the plate-shaped member or less, which requires complicated calculations. The means for blocking plasma may alternatively be a plate-like member that is arranged in the exhaust line so that a gap is provided between the plate-like member and an inner wall of the exhaust line.

Next, examples of the present invention using the plasma CVD apparatus shown in FIG. 1 will be explained, but the present invention is not limited to any of these examples.

The plasma CVD apparatus shown in FIG. 1 was used to form a deposited film of an amorphous silicon semiconductor on a 150-mm-square glass substrate. The plasma processing conditions were as follows: a raw material gas mixture obtained by mixing 100 scam of $SiH_4$ and 1000 scam of $H_2$ was introduced through a gas introducing section 10, the pressure in the plasma processing chamber 1 was maintained at 133 Pa, the temperature of a substrate was maintained at 250° C., and an RF high frequency of 13.56 MHz and 200 W was applied to the power applying electrode 5 through a high-frequency introducing section 7. A rotary pump and a mechanical booster pump were used as an exhaust means 2. A prismatic line of 20×200 mm opening size was used as an exhaust line 3 after sufficient cleaning.

As the heat elements 13a to 13c acting as the first metal member, coils formed by spirally winding three molybdenum wires of 1 mm diameter and 500 mm length were installed in such a manner that their longitudinal direction aligned with the vertical direction in the sheet of FIG. 1, and 300-W DC power was applied to each of the coils, which were then heated. The heating element 13a was installed 8 mm away from an end portion of the discharge region 12 toward the exhaust means 2, the heating element 13b was installed 11 mm away from the end portion of the discharge region 12 toward the exhaust means 2, and the heating element 13c was installed 14 mm away from the end portion of the discharge region 12 toward the exhaust means 2.

EXAMPLE 1

In the apparatus shown in FIG. 1, as a second metal member 14 acting as the means for blocking plasma, a coil formed by winding an electrically grounded tungsten wire of 1 mm diameter and 500 mm length was installed 5 mm away from the end portion of the discharge region 12 in such a manner that its longitudinal direction aligned with the vertical direction in the sheet of FIG. 1. An amorphous silicon film was formed on a glass substrate, and the electron number density and the deposition of byproducts on the chemical-reaction means (the heating elements 13a to 13c as the first metal members) were checked at positions 4 mm and 7 mm away from the plasma processing chamber toward the exhaust means 2.

As a result, the electron number density was $5\times10^8$ $cm^3$ at the 4-mm position and $3\times10^3$ $cm^{-3}$ at the 7-mm position; this indicates a substantial decrease in electron number density. At this time, no byproduct was observed to be deposited on the chemical-reaction means, and no byproduct deposited after 100 hours of subsequent film formation.

COMPARATIVE EXAMPLE 1

In the comparative example of Example 1, a film was formed by using the same apparatus configuration and film formation conditions as those of Example 1 except that the means for blocking plasma, shown in FIG. 1 was not electrically grounded but was allowed to electrically float. The electron number density and the deposition of byproducts on the chemical-reaction means (the heating elements 13a to 13c as the first metal members) were checked at positions 4 mm and 7 mm away from the plasma processing chamber toward the exhaust means 2.

As a result, the electron number density was $5\times10^8$ $cm^{-3}$ at the 4-mm position and $5\times10^8$ $cm^{-3}$ at the 7-mm position away from the end portion of the discharge region 12 toward the exhaust means 2, whereby no decrease in electron number density was observed.

This is assumed to be because the means for blocking plasma was electrically floating and therefore had a potential almost the same as a plasma potential near the position where this means was installed, thereby failing to block the plasma.

Further, at this time, a small amount of byproducts were observed to be deposited on the chemical-reaction inducing means, which thus had to undergo maintenance after 50 hours of film formation.

EXAMPLE 2

A film was formed using the same apparatus configuration shown in FIG. 1 and film forming conditions similar as those of Example 1, except that (a) the second metal member acting as the means for blocking plasma was omitted. Further, a film was formed using the same apparatus configuration and film forming conditions as those of Example 1 except that the second metal member acting as the means for blocking plasma is a member composed of a material containing (b) chromium, (c) molybdenum, (d) vanadium, (e) niobium, (f) tantalum, (g) titanium, (h) zirconium, or (i) hafnium. Table 1 shows results of these cases (a) to (i) in terms of the electron number density and the deposition state of byproducts on the chemical-reaction means (the heating elements 13a to 13c as the first metal members) obtained at a position 7 mm away from the end portion of the discharge region 12 toward the exhaust means 2.

In Table 1, symbol ⊚ indicates that a hard film attached to and deposited on the chemical-reaction inducing means and no byproduct was observed to be deposited after film formation for 100 hours;

symbol ○ indicates that a hard film attached to and deposited on the chemical-reaction inducing means and a small amount of byproducts were observed to be deposited after film formation for 100 hours; and symbol Δ indicates that byproducts were observed to be deposited and the chemical-reaction inducing means had to undergo maintenance after film formation for 50 hours.

As shown in Table 1, the means for blocking plasma has been observed to improve the processing ability of the chemical-reaction inducing means.

EXAMPLE 3

A film was formed using the same apparatus configuration shown in FIG. 1 and film forming conditions as those of Example 1, except that an electrically grounded plate-like member having circular openings is provided as the second metal member acting as the means for blocking plasma. The diameter of the openings was varied from 0.5 mm to 5 mm. Table 2 shows results of the variation of the diameter of the openings from 0.5 mm to 5 mm in terms of the electron number density and the deposition state of byproducts on the chemical-reaction means (the heating elements 13a to 13c as the first metal members) obtained at a position 7 mm away from the end portion of the plasma processing chamber toward the exhaust means 2. The electron number density was $5\times10^8$ cm$^{-3}$ at the 4-mm from the end portion of the discharge region 12 toward the exhaust means 2.

In Table 2,

Symbol ⊚ indicates that a hard film attached to and deposited on the chemical-reaction inducing means and no byproduct was observed to be deposited after film formation for 100 hours;

Symbol ○ indicates that a hard film attached to and deposited on the chemical-reaction inducing means and a small amount of byproducts were observed to be deposited after film formation for 100 hours; and symbol Δ indicates that byproducts were observed to be deposited and the chemical-reaction inducing means had to undergo maintenance after film formation for 50 hours.

As described previously, the minimum opening diameter must be double the sheath length or less in order to block plasma, and this sheath length is expected to be in a range of $10^{-1}$ mm to 10 mm. In the example 3, since the openings are circular, the minimum diameter corresponds to the opening diameter.

Table 2 shows that both the electron number density and the deposition of byproducts varied rapidly when the opening diameter was 4.5 mm or more, whereby the opening diameter of 4 mm to 4.5 mm corresponds to double the sheath length.

These results also indicate that the ability of the chemical-reaction means for processing byproducts is improved by blocking plasma.

As described above, according to the present invention, in the plasma processing method and apparatus utilizing plasma CVD, etching, or doping as well as the associated exhaust processing method, the ability of processing unreacted gases and byproducts can be improved by processing the unreacted gases and byproducts without allowing plasma to reach the chemical-reaction inducing means. Thus, the corrosion of the exhaust line, the valve, or the exhaust pump and the deposition of byproducts thereon can be prevented to reduce the frequency of maintenance over a long period, thereby improving the operation rate and simplifying the apparatus.

The present invention also provides an exhaust processing method, a plasma processing method and a plasma processing apparatus which can sufficiently and efficiently remove unreacted gases and byproducts having increased amount generated when films are formed over a large area and over a long period, without affecting deposited films.

TABLE 1

|  | Inside plasma processing chamber | No plasma blocking means | Cr | Mo | V | Nb | Ta | Ti | Zr | Hf |
|---|---|---|---|---|---|---|---|---|---|---|
| Electron density (cm$^{-3}$) | $5 \times 10^8$ | $5 \times 10^8$ | $4 \times 10^5$ | $4 \times 10^4$ | $5 \times 10^5$ | $2 \times 10^5$ | $3 \times 10^5$ | $5 \times 10^4$ | $3 \times 10^4$ | $5 \times 10^4$ |
| Deposition state of byproducts |  | Δ | ○ | ⊚ | ○ | ○ | ○ | ⊚ | ⊚ | ⊚ |

TABLE 2

| Opening diameter (mm) | 0.5 | 1 | 1.5 | 2 | 2.5 | 3 | 3.5 | 4 | 4.5 | 5 |
|---|---|---|---|---|---|---|---|---|---|---|
| Electron number density ($cm^{-3}$) | $3 + 10^3$ | $7 + 10^3$ | $8 + 10^3$ | $2 + 10^4$ | $2 + 10^4$ | $5 + 10^4$ | $7 + 10^4$ | $5 + 10^5$ | $5 + 10^8$ | $5 + 10^8$ |
| Depostion state of by-products | ⊚ | ⊚ | ⊚ | ⊚ | ⊚ | ⊚ | ⊚ | ○ | Δ | Δ |

What is claimed is:

1. An exhaust processing method of exhausting a processing space for subjecting a substrate or a film to processing with plasma, which comprises:
    (a) providing a chemical-reaction inducing unit having a heating element comprising a first metal member in an exhaust line, said exhaust line connecting the processing space and an exhaust unit for exhausting the processing space, wherein the first metal member is connected to a power source;
    (b) providing a plasma blocking unit consisting of a second metal member electrically grounded between the processing space and the first metal member; wherein the chemical-reaction inducing unit is provided at a position where the plasma reaches if no plasma blocking unit were employed, and the plasma blocking unit blocks the plasma from reaching the chemical-reaction inducing unit; and
    (c) causing chemical reaction of at least either an unreacted gas or a by-product exhausted from the processing space via heat from said heating element while said plasma blocking unit acts to reduce electron number density in the plasma reaching the chemical-reaction inducing unit by at least 90%.

2. The exhaust processing method according to claim 1, wherein one or more linear members or a linear member formed by a spiral winding are used as the unit for blocking plasma.

3. The exhaust processing method according to claim 1, wherein a mesh is used as the unit for blocking plasma.

4. A plasma processing method for subjecting a substrate or a film to processing with plasma, which comprises:
    (a) arranging a chemical-reaction inducing unit having a heating element comprising a first metal member in an exhaust line, said exhaust line connecting a processing space for plasma processing and an exhaust pump for exhausting the processing space, wherein the first metal member is connected to a power source;
    (b) providing a plasma blocking unit consisting of a second metal member electrically grounded between the processing space and the first metal member; wherein the chemical reaction inducing unit is provided at a position where the plasma reaches if no plasma blocking unit were employed, and the plasma blocking unit blocks the plasma from reaching the chemical reaction inducing unit; and
    (c) causing chemical reaction of at least either an unreacted gas or a by-product exhausted from the processing space via heat from said heating element while said plasma blocking unit acts to reduce electron number density in the plasma reaching the chemical-reaction inducing unit by at least 90%.

5. The plasma processing method according to claim 4, wherein one or more linear members or a linear member formed by a spiral winding are used as the unit for blocking plasma.

6. The plasma processing method according to claim 4, wherein a mesh is used as the unit for blocking plasma.

* * * * *